(12) United States Patent
Schouten et al.

(10) Patent No.: US 6,900,669 B1
(45) Date of Patent: May 31, 2005

(54) AREA EFFICIENT ON-CHIP TIMEOUT GENERATOR WITH LOW TEMPERATURE AND LOW SUPPLY VOLTAGE DEPENDENCY

(75) Inventors: Andre Schouten, Inverkip (GB); Stephen O'Kane, Greenock (GB)

(73) Assignee: National Semiconductor Corporation, Santa Clara, CA (US)

( * ) Notice: Subject to any disclaimer, the term of this patent is extended or adjusted under 35 U.S.C. 154(b) by 25 days.

(21) Appl. No.: 10/650,594

(22) Filed: Aug. 27, 2003

(51) Int. Cl.$^7$ ............................................... H03K 5/153
(52) U.S. Cl. .......................................... 327/77; 327/143
(58) Field of Search ............................ 327/77, 78, 83, 327/142, 143, 198, 512, 513; 320/157–159, 162–164, 166

(56) References Cited

U.S. PATENT DOCUMENTS 5,942,921 A * 8/1999 Talaga, Jr. ................... 327/77
6,686,783 B1 * 2/2004 Huang ......................... 327/143

* cited by examiner

*Primary Examiner*—Long Nguyen
(74) *Attorney, Agent, or Firm*—Merchant & Gould P.C.; Mark R. Hennings

(57) ABSTRACT

An area-efficient fully integrated BiCMOS analog time delay circuit with low-power supply requirements provides delays as long as two milliseconds. An ultralow PTAT current source comprises medium-value resistors to discharge an on-chip capacitor from a fixed zero-temperature coefficient voltage. The comparator monitors the capacitor voltage and changes stage from low to high when the capacitor is discharged below a reference voltage having a defined negative temperature coefficient. The temperature coefficient of the reference voltage generator and the PTAT current source are such that the timeout period is independent of temperature in the first-order. The generated timeout delay is independent of the supply voltage and can be used with a supply voltage as low as two volts.

19 Claims, 3 Drawing Sheets

AREA EFFICIENT ON-CHIP TIMEOUT GENERATOR WITH LOW TEMPERATURE AND LOW SUPPLY VOLTAGE DEPENDENCY

The present invention relates to electronic timing circuits, and more particularly to timeout generators.

BACKGROUND OF THE INVENTION

Timeout functions are required in many applications, such as delayed reset functions. The timeout functions can be implemented by various means including pure analog means or combinations of analog and digital means. The analog implementations often require the charging and/or discharging of a capacitor that is compared against a voltage reference using a comparator. Conventional circuits typically use off-chip capacitors that are in the nanofarad range and large on-chip resistors in the megaohms range to provide timeout periods in the milliseconds range.

An appreciation of the present invention and its improvements can be obtained by reference to the accompanying drawings that are briefly summarized below, to the following detailed description of illustrated embodiments of the invention, and to the appended claims.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
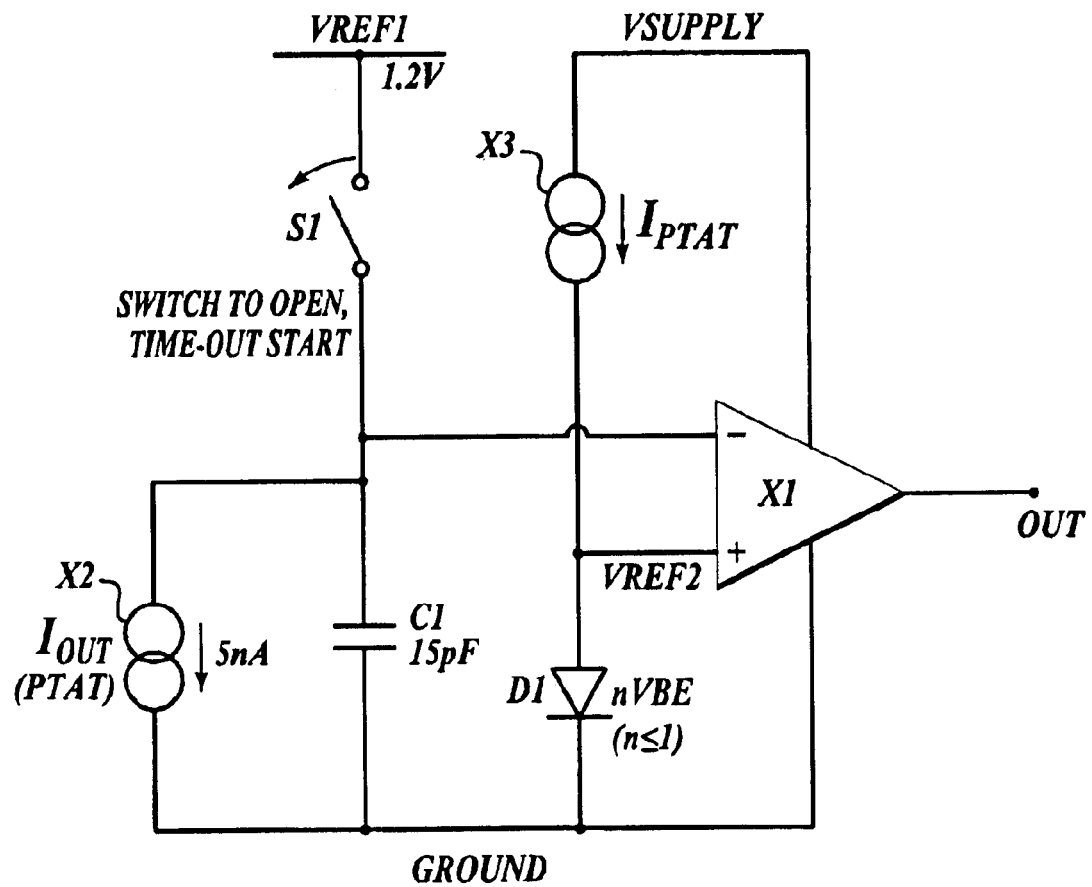
FIG. 1 illustrates an example timeout generator (100) that is arranged in accordance with aspects of the present invention.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to an area-efficient two-millisecond fully integrated BiCMOS analog time delay circuit with the time delay being temperature compensated and supply voltage independent. An ultralow PTAT (Proportional-To-Absolute-Temperature) current source comprises medium-value resistors to discharge an on-chip capacitor from a fixed zero-temperature coefficient voltage. The comparator monitors the capacitor voltage and changes stage from low to high when the capacitor is discharged below a reference voltage having a defined negative temperature coefficient. The negative temperature coefficient of the reference voltage and the positive temperature coefficient of the PTAT current source are such that the timeout period is independent of temperature to the first-order. The generated timeout delay is also independent of the supply voltage and can be used with a supply voltage as low as two volts. For example, an on-chip capacitor in the picofarad range and a medium value resistor of approximately 50 Kohms can be used in accordance with the present invention to generate a two-second temperature compensated and supply voltage independent timeout function.

An embodiment of the present invention uses analog components to generate timeout periods in the milliseconds range without requiring high values for on-chip components such as resistors or capacitors. For example, an embodiment comprising a 15 picofarad on-chip capacitor and a supply voltage of two volts can generate a timeout period in the millisecond range without using a resistor in the range of tens of Mohms. In contrast, conventional methods would require a current in the range of 10 nanoamps to achieve a timeout period in the millisecond range. To derive a 10 nA discharge current would typically require an on-chip resistor of several Mohms.

FIG. 1 illustrates an example timeout generator (100) that is arranged in accordance with aspects of the present invention. Generator 100 comprises switch S1, comparator X1, current sources X2–X3, timing capacitor C1, and diode D1. Current source X2 is an ultralow current generator having a positive temperature coefficient and is capable of producing currents in the nanoamps range.

VREF1 is provided, for example, by a bandgap reference voltage generator, and has a temperature coefficient that is substantially zero. VREF2 is generated by applying a current (generated by current source X3) to a base-emitter junction provided by diode D1. VREF2 has a negative temperature coefficient in contrast to the positive temperature coefficient of current source X2. The offsetting temperature coefficients operate to maintain a temperature coefficient of the timeout period generated by generator 100 that is independent of temperature in the first-order.

In operation, switch S1 is initially closed and timing capacitor C1 is charged to VREF1. When switch S1 is opened, generator 100 starts generating the timeout period. Current source X2 generates a current of 5 nanoamps, which is used to discharge timing capacitor C1. Comparator X1 monitors the voltage of the timing capacitor C1 and changes state from low to high when timing capacitor C1 discharges below VREF2.

Figure 2:
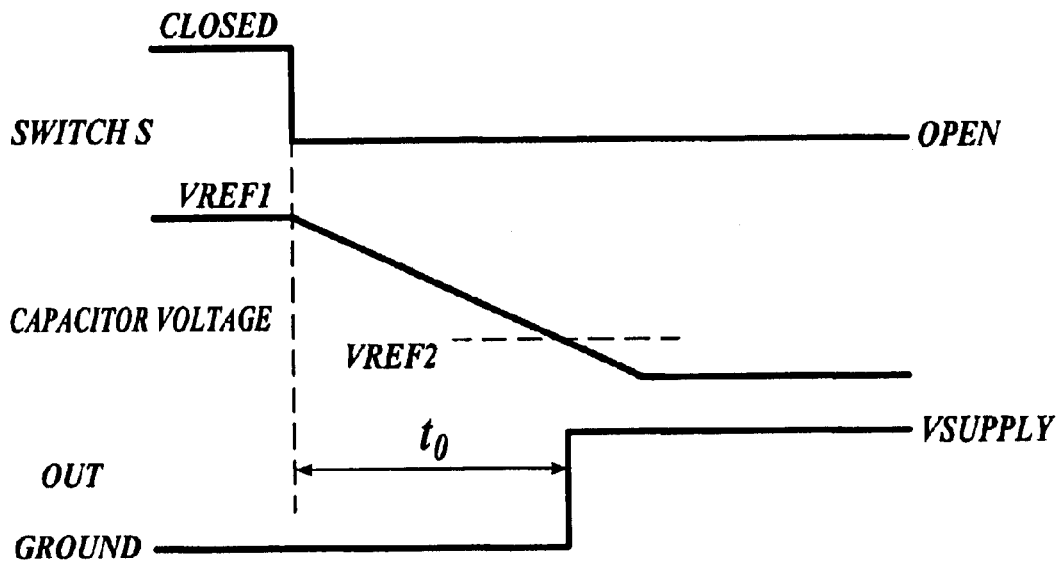
FIG. 2 is a timing diagram of an example timing generator operating in accordance with aspects of the present invention.

FIG. 2 is a timing diagram of an example timing generator operating in accordance with aspects of the present invention. When switch S1 is opened, the voltage of timing capacitor C1 falls from VREF1 to below VREF2. When the voltage of timing capacitor C1 falls below VREF2, comparator X1 changes state from low to high. Timeout period $t_0$ is the period of time from the opening of switch S1 to the transition of comparator X1 from the low state to the high state.

Timeout period $t_0$ can be expressed as:

$$t_0 = \frac{C1 \times (VREF1 - VREF2)}{I_{out}} \quad (I)$$

where VREF1 is equal to the bandgap reference voltage and VREF2 is equal to nVBE where n is equal to or less than unity.

In an exemplary embodiment using typical components, the timeout period $t_0$ can be expressed as:

$$t_0 = \frac{15pF \times (1.2V - 0.68V)}{4.5\ nA} = 1.7\ msec \quad (II)$$

where n is equal to unity.

Figure 3:
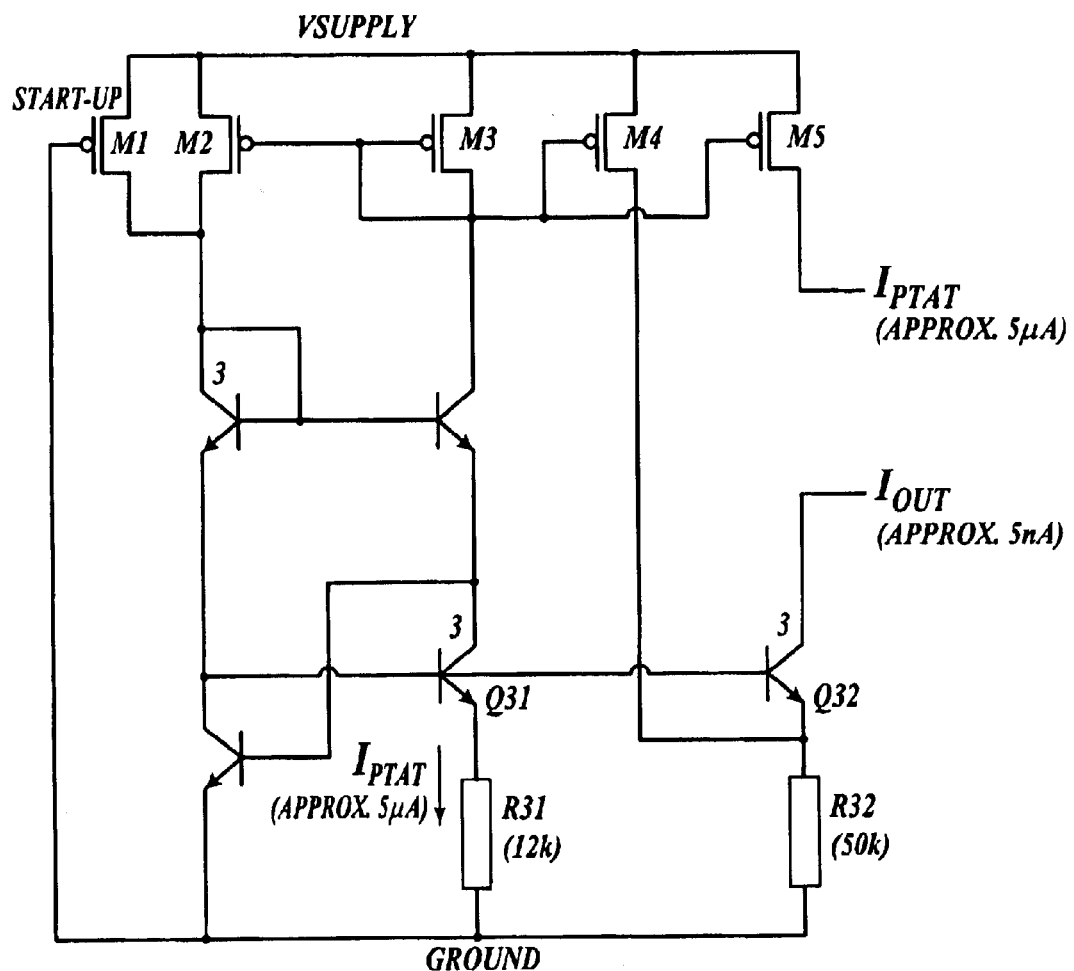
FIG. 3 is a schematic diagram of an example PTAT current source generator that is arranged in accordance with aspects of the present invention.

FIG. 3 is a schematic diagram of an example PTAT current source generator that is arranged in accordance with aspects of the present invention. In an embodiment of the invention, generator 300 comprises current sources X2 and X3. As shown in the figure, generator 300 comprises P-channel device M4, which is configured to generate output current $I_{PTAT}$. Output current $I_{PTAT}$ is applied to a node comprising a first terminal of resistor R31 and the emitter of NPN transistor Q31. The base of transistor Q31 is coupled to the base of transistor Q32 such that the transistors are biased equally. The collector of NPN transistor Q32 is arranged to provide output current $I_{out}$.

Current $I_{out}$ is a function of resistors R3 and R32, the relative scaling of the NPN transistors, and the PMOS transistors of generator 300. Current $I_{out}$ can be expressed as:

$$I_{out} = \frac{I_{PTAT}}{9(N-1)}\ where, \quad (III)$$

$$I_{PTAT} = \frac{VT \times \ln(9)}{R31}\ and, \quad (IV)$$

$$N = \frac{R32}{R31} \quad (V)$$

From Equations II, IV, and V above and a scale factor of 3, output current $I_{out}$ can be calculated as:

$$I_{out} = \frac{4.76 \mu A}{1051} = 4.5\ nA$$

Accordingly, the total resistance used to produce an output current $I_{out}$ of 4.5 nA is around 62 kohms, which represents a substantial reduction over conventional methods for implementing on-chip resistors for generating relatively long-term timeout periods. Furthermore, the NPN current output of $I_{out}$ can operate in the saturation region without affecting the IPTAT source due to the high $I_{PTAT}/I_{out}$ ratio.

Various embodiments of the invention are possible without departing from the spirit and scope of the invention. In the example shown in FIG. 3, the supply voltage variation of $I_{out}$ is largely affected by the output impedance of P-channel transistor M4. However, a variety of conventional cascoded arrangements for the P-channel current source can be used to reduce supply voltage dependencies. While PMOS transistor M1 is used for startup of the PTAT cell of generator 300, alternative start-up methods can be employed.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for generating a timeout signal, comprising:
    charging a timing capacitor using a first reference voltage that is temperature independent;
    changing the level of the charge of the timing capacitor using a first current source that has a temperature coefficient of a first polarity;
    changing a state of the timeout signal at a first time in response to initiating the changing of the level of the charge of the timing capacitor; and
    comparing a voltage of the timing capacitor such that the state of the timeout signal changes at a second time in response to the voltage of the timing capacitor reaching a second reference voltage having a temperature coefficient of a second polarity that is the opposite of the first polarity, wherein the first and second polarities are related such that the duration from the first time to the second time is independent of temperature in the first order.

2. The method of claim 1, wherein the first reference voltage is generated by a bandgap reference voltage generator.

3. The method of claim 1, wherein the second reference voltage is generated by applying a PTAT-generated current to a PN junction of a device.

4. The method of claim 1, wherein the first current source is a nanoamp-range PTAT current source.

5. The method of claim 4, wherein the first current source comprises Kohm-range resistors, and wherein the level of the charge of the timing capacitor is discharged through the Kohm-range resistors.

6. The method of claim 1, wherein the first temperature coefficient polarity is positive, and the second temperature coefficient polarity is negative.

7. A timeout signal generator circuit for generating a timeout signal, comprising:
    means for charging a timing capacitor, wherein the means for charging comprise a first reference voltage that is temperature independent;
    means for changing the level of the charge of the timing capacitor, wherein the means for changing the level of the charge comprise a first current source that has a temperature coefficient of a first polarity;
    means for changing a state of the timeout signal at a first time in response to initiating the changing of the level of the charge of the timing capacitor; and
    means for comparing a voltage of the timing capacitor such that the state of the timeout signal changes at a second time in response to the voltage of the timing capacitor reaching a second reference voltage that has a temperature coefficient of a second polarity that is the opposite of the first polarity, wherein the first and second polarities are related such that the duration from the first time to the second time is independent of temperature in the first order.

8. The circuit of claim 7, wherein the first reference voltage is generated by a bandgap reference voltage generator.

9. The circuit of claim 7, wherein the second reference voltage is generated by applying a PTAT-generated current to a PN junction of a device.

10. The circuit of claim 7, wherein the first current source is a nanoamp-range PTAT current source.

11. The circuit of claim 10, wherein the first current source comprises Kohm-range resistors, and wherein the level of the charge of the timing capacitor is discharged through the Kohm-range resitors.

12. The circuit of claim 7, wherein the first temperature coefficient polarity is positive, and the second temperature coefficient polarity is negative.

13. A timeout signal generator circuit, comprising:
- a switch that is arranged to couple a first reference voltage that is temperature independent to a timing capacitor such that the timing capacitor is charged to the first reference voltage in response to the switch being closed;
- a first current source having a temperature coefficient of a first polarity that is configured to discharge the timing capacitor in response to the switch being opened;
- a second current source that is configured to produce a second reference voltage across a PN junction element such that the second reference voltage has a temperature coefficient that is opposite of the first polarity; and
- a comparator that is arranged to change a state of the timeout signal at a first time in response to the switch being closed and that is further arranged to change the state of the timeout signal at a second time in response to a voltage of the timing capacitor falling below the second reference voltage.

14. The circuit of claim 13, wherein the first reference voltage is generated by a bandgap reference voltage generator.

15. The circuit of claim 13, wherein the second current source is a PTAT current source.

16. The circuit of claim 13, wherein the first current source is a nanoamp-range PTAT current source.

17. The circuit of claim 16, wherein the first current source comprises Kohm-range resistors, and wherein the timing capacitor is discharged through the Kohm-range resistors.

18. The circuit of claim 13, wherein the first temperature coefficient polarity is positive, and the second temperature coefficient polarity is negative.

19. The circuit of claim 16, wherein the first current source does not comprise resistors having a value of greater than 100 Kohms.

* * * * *